United States Patent [19]
Hashimoto

[11] Patent Number: 6,010,955
[45] Date of Patent: Jan. 4, 2000

[54] ELECTRICAL CONNECTION FORMING PROCESS FOR SEMICONDUCTOR DEVICES

[75] Inventor: Koji Hashimoto, Yokohama, Japan

[73] Assignee: Kabushiki Kaisha Toshiba, Kawasaki, Japan

[21] Appl. No.: 08/717,974

[22] Filed: Sep. 23, 1996

[51] Int. Cl.[7] .............................. H01L 21/28; H01L 21/31
[52] U.S. Cl. ...................... 438/597; 438/586; 438/622; 438/624; 438/637; 438/638; 438/641; 438/671
[58] Field of Search ..................... 438/597, 618, 438/622, 623, 626, 629, 631, 637, 669, 671, 586, 624, 638, 641

[56] References Cited

U.S. PATENT DOCUMENTS

| | | | |
|---|---|---|---|
| 4,621,415 | 11/1986 | Tran | 29/589 |
| 4,939,071 | 7/1990 | Barrera et al. | 430/314 |
| 4,963,501 | 10/1990 | Ryan et al. | 437/40 |
| 5,158,910 | 10/1992 | Cooper et al. | 438/631 |
| 5,171,718 | 12/1992 | Ishibashi et al. | 437/229 |
| 5,264,382 | 11/1993 | Watanabe | 437/41 |
| 5,300,445 | 4/1994 | Oku | 437/40 |
| 5,413,668 | 5/1995 | Aslam et al. | 216/2 |
| 5,484,747 | 1/1996 | Chien | 438/644 |
| 5,677,243 | 10/1997 | Ohsaki | 438/638 |

*Primary Examiner*—T. N. Quach
*Attorney, Agent, or Firm*—Banner & Witcoff, Ltd.

[57] ABSTRACT

An etch-less process for forming an electrical connection is disclosed. A resist pattern is formed on a substrate. An insulating layer is formed on the substrate, but not on the resist pattern. The resist pattern is then removed to form an opening in the insulating layer and a conductive layer is formed in the opening. Multiple insulating layers and multiple resist patterns may be used.

11 Claims, 5 Drawing Sheets

ABSTRACT

ELECTRICAL CONNECTION FORMING PROCESS FOR SEMICONDUCTOR DEVICES

BACKGROUND OF THE INVENTION

1. Technical Field

The present invention generally relates to forming electrical connections for semiconductor devices and, more particularly, to an etch-less process for forming electrical connections in highly integrated semiconductor devices.

2. Description of the Related Art

Various processes are used in the fabrication of semiconductor devices in order to form the electrical connections between the device elements and the wirings for connecting the device to external devices. For example, multilevel metallization processes have been found to be useful for simplifying the fabrication of large scale integrated (LSI) devices. Such processes may be carried out to simultaneously form a wiring layer and a contact. One such multilevel metallization process is a so-called "dual damascene"0 process. A dual damascene process for forming a bit line and a bit line contact will be described with reference to FIGS. 1(a)–1(g). FIG. 1(a) shows a plurality of gate electrode structures 10 which are formed on a semiconductor (e.g., silicon) substrate 5. Gate electrode structures 10 each include a stacked arrangement of a polysilicon layer 15 and a silicon nitride ($Si_3N_4$) layer 20 which is insulatively spaced by a gate insulating film 25 from a channel region between diffusion regions 22 formed in semiconductor substrate 5. Gate insulating film 25 may be formed of silicon dioxide ($SiO_2$), for example. Silicon nitride sidewall spacers 30 are formed on the sidewalls of the stacked arrangement of polysilicon layer 15 and silicon nitride layer 20. As shown in FIG. 1(a), an insulating layer 35 of silicon dioxide, for example, is formed on semiconductor substrate 5 and gate electrode structures 10. A first patterned resist layer 40 is then formed as shown in FIG. 1(b) and a contact hole 45 which exposes one of diffusion regions 22 is formed by using an etching process for etching insulating film 35 as shown in FIG. 1(c). The etching process may, for example, be a highly selective reactive ion etching (RIE) process so that a certain silicon nitride thickness remains on the gate polsilicon to avoid contact-to-gate shorting. A second patterned resist layer 50 is then formed as shown in FIG. 1(d) and a bit line trench 55 is subsequently formed by an etching process such as RIE for etching insulating layer 35 as shown in FIG. 1(e). Next, a conductive layer 60 of, for example, a metal such as tungsten, is formed as shown in FIG. 1(f). Conductive layer 60 is then polished by chemical mechanical polishing (CMP) as shown in FIG. 1(g).

It would be desirable to separately optimize the etching processes for the multilevel metallization process to satisfy device specifications. For example, at the bit line level, the bit line should be formed, for example, to satisfy open and short yield requirements. For the bit line contact, the etching process should be optimized to provide sufficient margin for simultaneously avoiding gate-to-contact shorts and contact-to-diffusion area opens. However, such optimization requires complicated etching processes, thereby increasing the fabrication costs of the semiconductor devices. In addition, the upper level lithography processes for forming a multilayer metallization or for forming subsequent layers on a single layer metallization may be carried out on a surface which has an uneven topography resulting from previously formed layers. This uneven topography will most likely require high resolution lithography processes to achieve the high critical dimension (CD) control needed for highly integrated semiconductor devices. These high resolution processes become more complicated as the integration density of semiconductor devices increases and the ground rules are decreased to 0.25 micrometers and below.

SUMMARY OF THE INVENTION

In accordance with a first aspect of the present invention, a method of forming a conductive structure without etching is disclosed. A resist pattern is formed on a substrate. An insulating layer is formed on the substrate, but not on the resist pattern. The resist pattern is then removed to form an opening in the insulating layer and a conductive layer is formed in the opening.

In accordance with a second aspect of the present invention, a method of forming a conductive structure without etching is disclosed. A first resist pattern is formed on a substrate. Next, a first insulating layer is formed on the substrate, but not on the first resist pattern. A second resist pattern is then formed on the first insulating layer and the first resist pattern. Next, a second insulating layer is formed on the first insulating layer, but not on the second resist pattern. The first and second resist patterns are removed to form an opening in the first and second insulating layers and a conductive layer is formed in the opening.

These and other features and aspects of the invention will be apparent from the following detailed description read in conjunction with the appended drawings.

DESCRIPTION OF THE PREFERRED EMBODIMENTS

The electrical connection formation process of the present invention will be explained with reference to FIG. 2 and FIGS. 3(a) to 3(g). The process description below will be given with respect to a process for forming a multilevel metallization structure which constitutes a contact to a source/drain region of a field effect transistor and a bit line of a semiconductor memory device such as a dynamic random access memory (RAM), a static random access memory (SRAM), and the like. However, the process of the present invention is not limited in this respect and it will be apparent that the inventive process may be applied to other single level or multilevel processes for forming electrical connections for semiconductor devices. For example, the process can be applied to single or multilevel metallizations involving bit lines, bit line contacts, and gate contacts. In addition, the process can be applied to single or multilevel metallizations for contacting wiring layers.

Figure 1A:
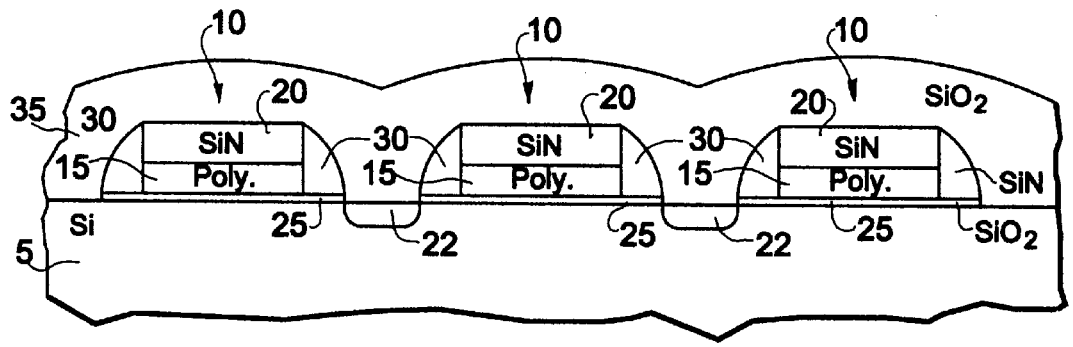
FIGS. 1(a)–1(g) illustrate a prior art metallization process.
Figure 1B:
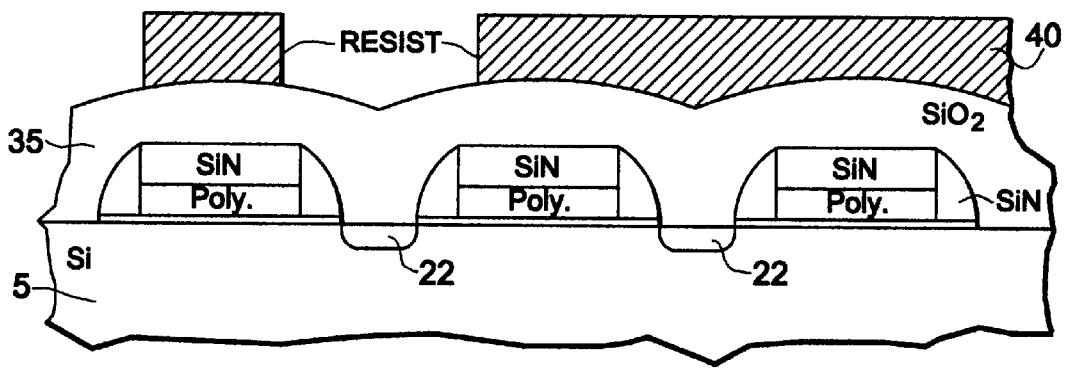
Figure 1C:
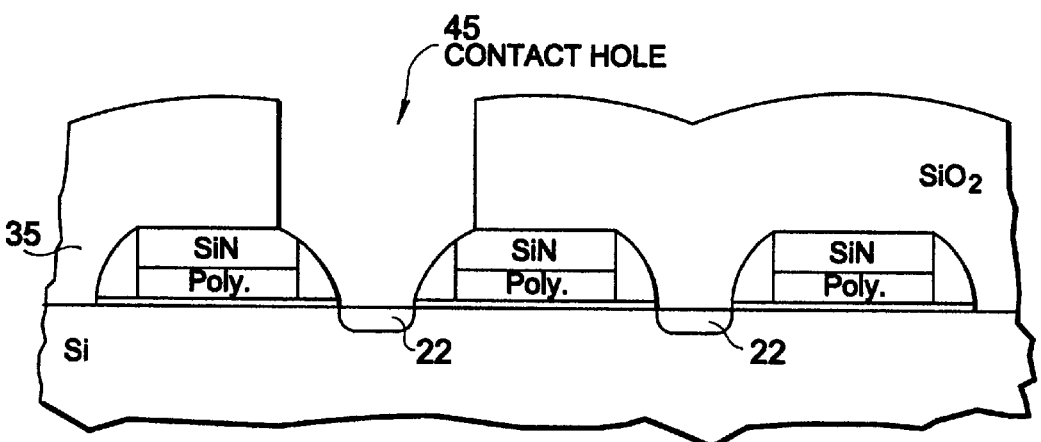
Figure 1D:
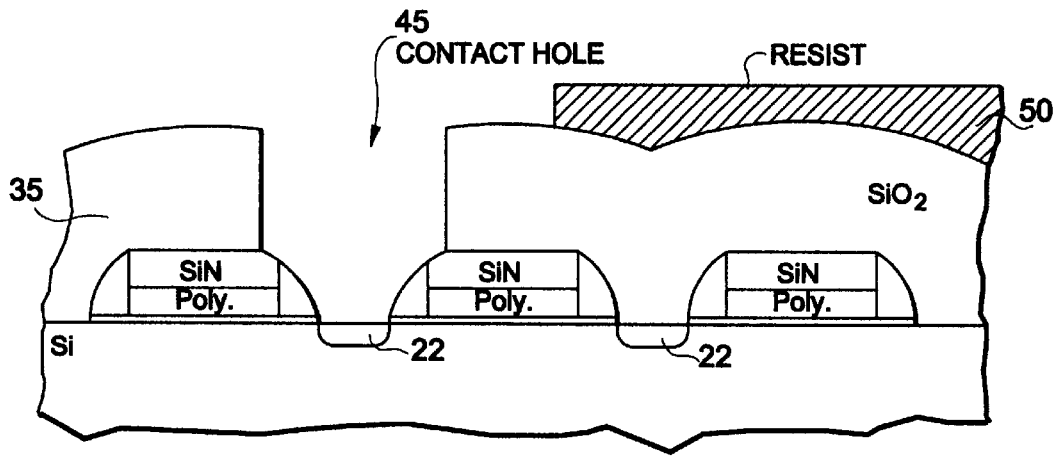
Figure 1E:
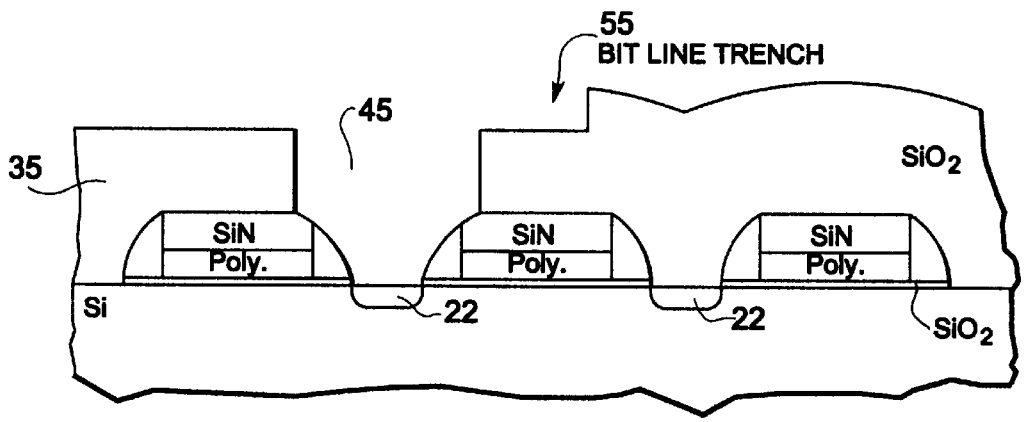
Figure 1F:
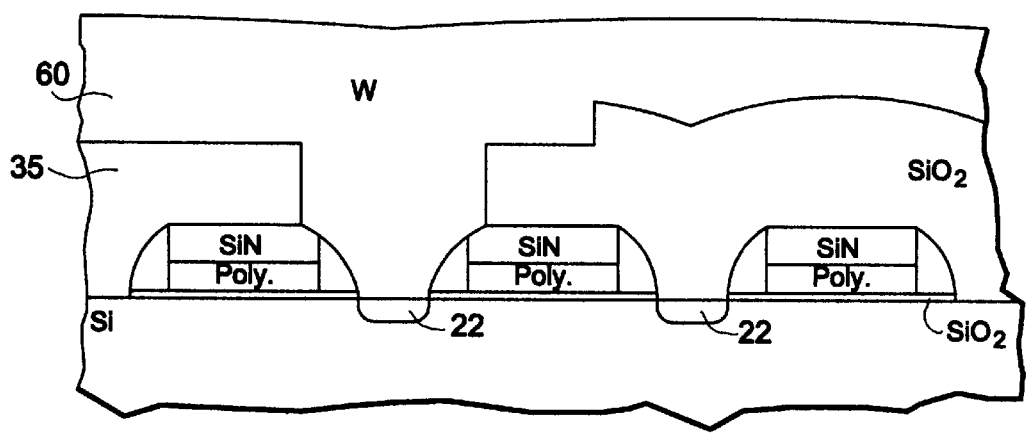
Figure 1G:
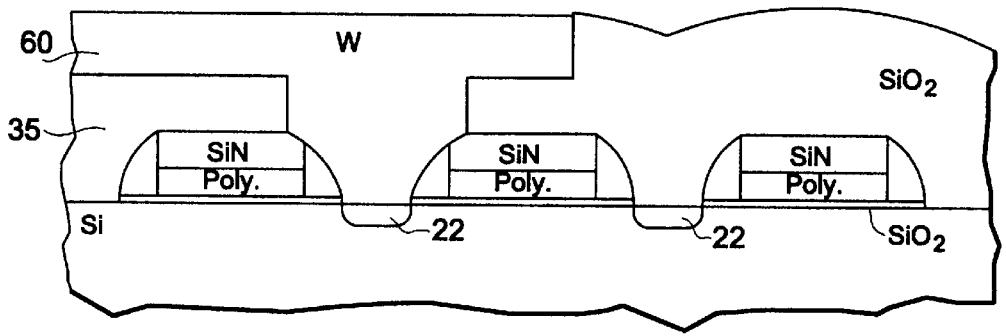
Figure 2:
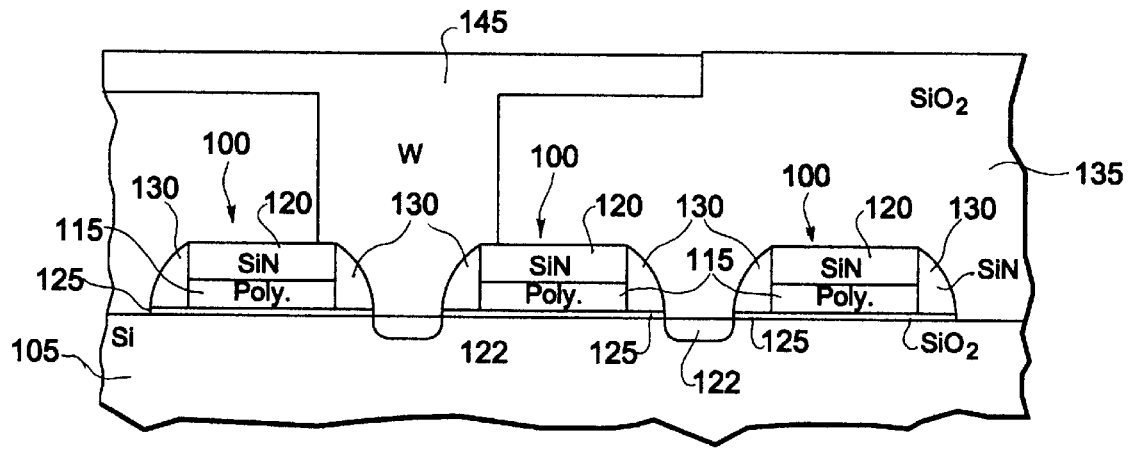
FIG. 2 illustrates a portion of a semiconductor device having an electrical connection formed in accordance with the process of the present invention.
Figure 3A:
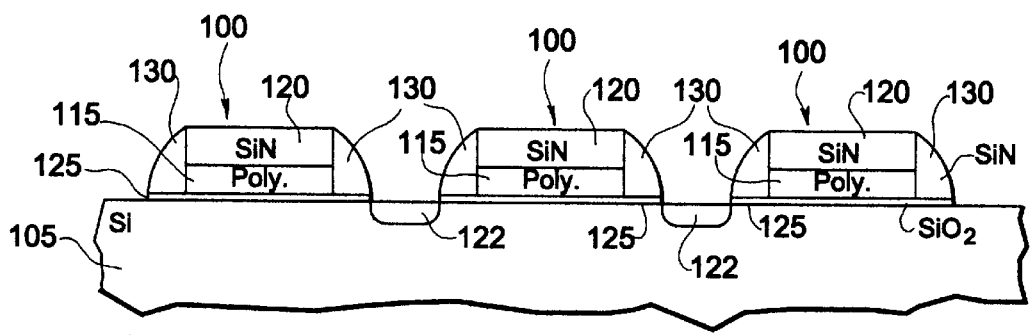
FIGS. 3(a)–3(g) illustrate an electrical connection formation process in accordance with the present invention.
Figure 3B:
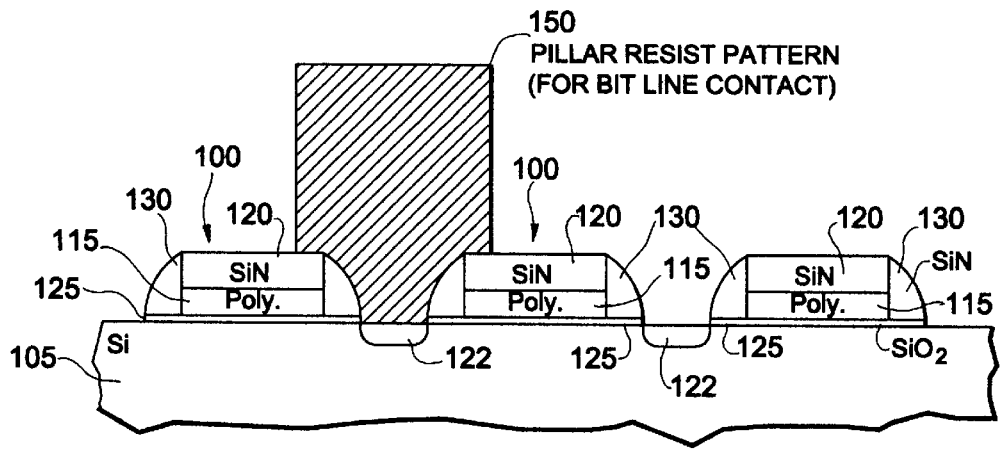
Figure 3C:
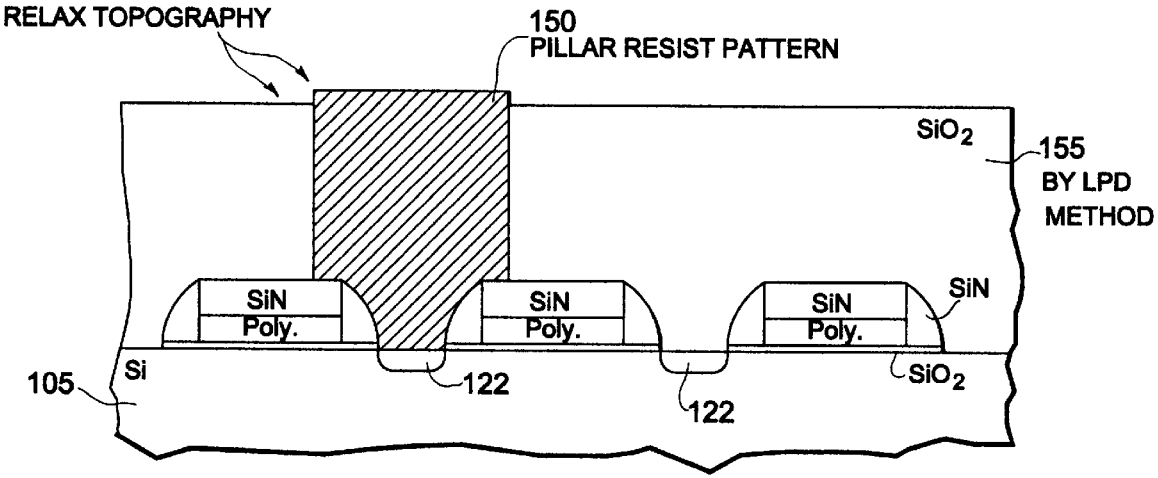
Figure 3D:
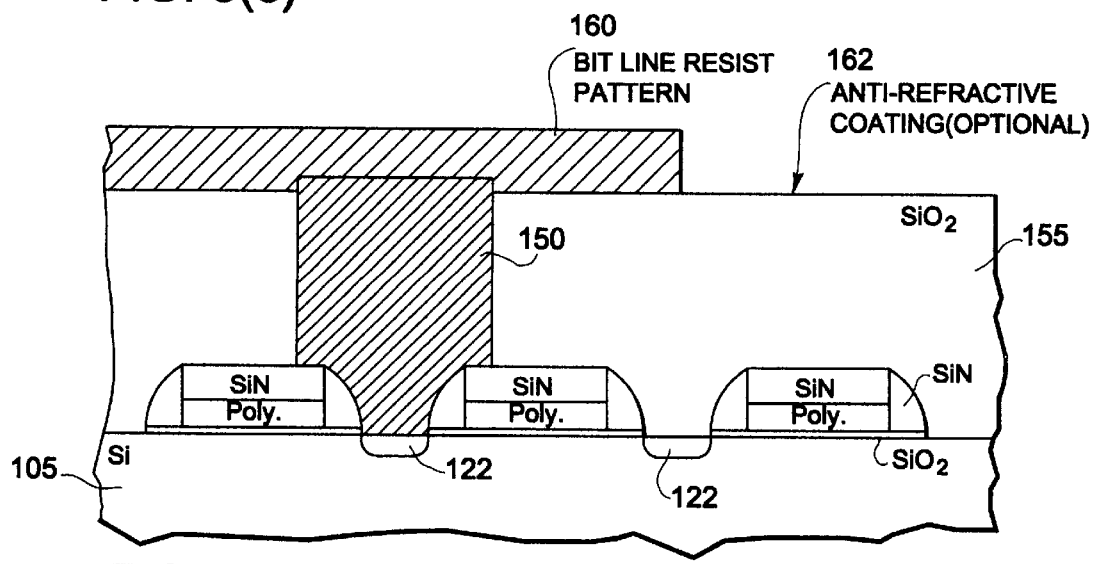
Figure 3E:
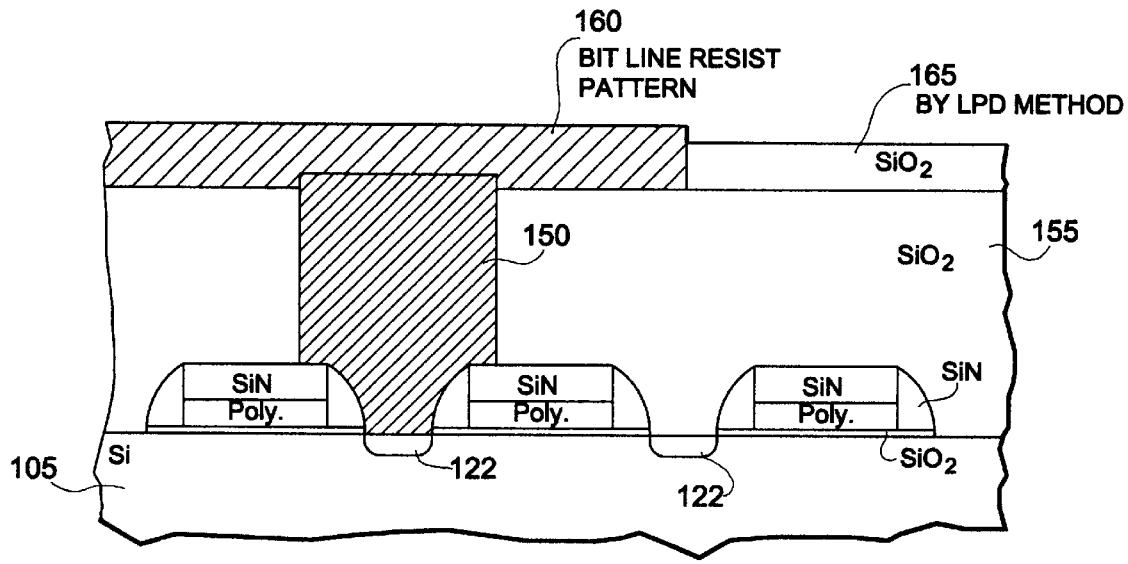
Figure 3F:
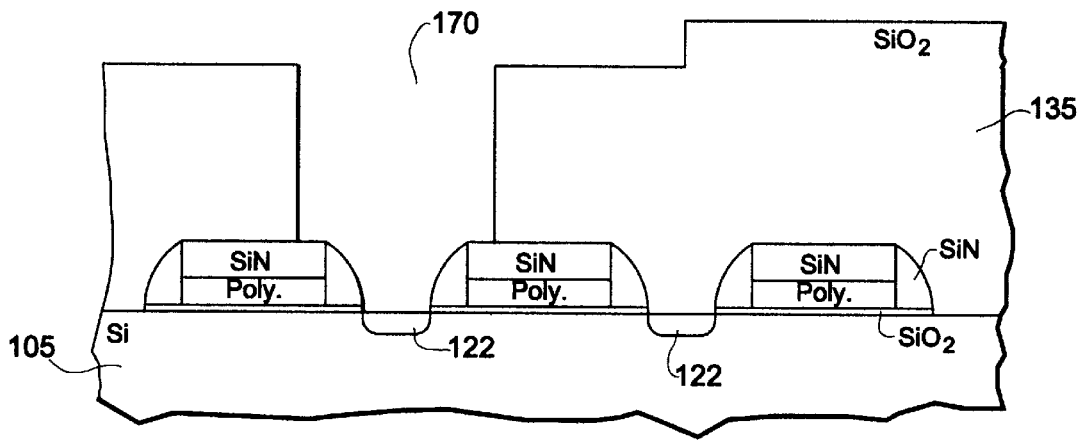
Figure 3G:
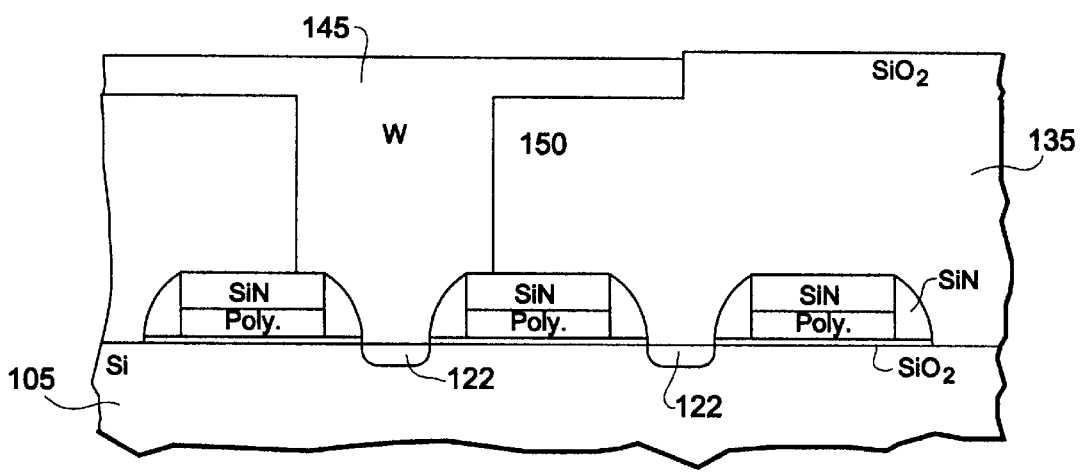

FIG. 2 shows a plurality of gate electrode structures 100 formed on a surface of a substrate 105. Substrate 105 may be a P-type silicon substrate, although the invention is not limited in this respect. Each gate electrode structure 100 includes a stacked arrangement of a polysilicon layer 115 and a silicon nitride ($Si_3N_4$) layer 120 which is insulatively spaced by a gate insulating film 125 from a channel region between N-type diffusion regions 122 formed in substrate 105. Gate insulating film 125 may, for example, be a silicon dioxide (SiO$_2$) film. Silicon nitride sidewall spacers 130 are formed on the sidewalls of the stacked arrangement of polysilicon layer 115 and silicon nitride layer 120. An interlayer insulating film 135 of silicon dioxide, for example, is formed over gate electrode structures 100 and substrate 105. A multilevel metallization layer 145 of tungsten, for example, contacts one of the diffusion regions 122 formed in the surface of substrate 105 and forms a bit line of the semiconductor memory device.

FIGS. 3(*a*)–3(*g*) illustrate a multilevel metallization process for forming the device of FIG. 2. As shown in FIG. 3(*a*), gate electrode structures 100 are formed on the surface of substrate 105. Gate electrode structures 100 may be formed by any conventional technique. For example, a thin silicon dioxide film 125 having a thickness of about 100 Å may be formed on the surface of silicon substrate 105 by thermal oxidation. Then, a conductive layer 115 of, for example, polysilicon and a first silicon nitride layer 120 may be successively formed on silicon dioxide film 125. Conductive layer 115 may be formed by a chemical vapor deposition (CVD) process or a sputtering process to a thickness of about 1000 Å and silicon nitride layer 120 may be formed by CVD to a thickness of about 2000 Å. Conductive layer 115 and silicon nitride layer 120 may then be patterned. A second silicon nitride layer having a thickness of about 500 Å may then be deposited and patterned to produce sidewall spacers 130. These sidewall spacers prevent gate-to-contact shorting. N-type impurities may then be implanted by ion implantation, for example, using gate electrode structures 100 as a mask. The implanted impurities may then be diffused by heating to form diffusion regions 122.

Next, a pillar resist pattern 150 for the contact portion of the multilayer metallization is formed as shown in FIG. 3(*b*). If desired, prior to forming pillar resist pattern 150, a weak oxidation process may be performed to form a thin silicon dioxide film (not shown) on diffusion regions 122 to avoid direct contact between the silicon substrate surface and the resist. Thus, contamination of the silicon substrate by the resist can be avoided. The lithography process for forming pillar resist pattern 150 uses a mask having a polarity which is opposite to the polarity of the mask used to form the patterned resist 40 in the conventional process of FIG. 1. Alternatively, the same mask used to form the patterned resist 40 in the conventional process of FIG. 1 can be used with a resist of a polarity type which is opposite to the polarity type of the resist used in the conventional process. Next, a silicon dioxide film 155 having a thickness of about 10,000 Å is deposited on gate electrode structures 100 and substrate 105 using liquid phase deposition (LPD) as shown in FIG. 3(*c*). Silicon dioxide film 155 is not formed on pillar resist pattern 150 and is formed to a level which is substantially the same as the level of pillar resist pattern 150. Since silicon dioxide film 155 and pillar resist pattern 150 are at substantially the same level, the wafer topography is "relaxed" and the need for subsequent high resolution lithography processes is mitigated.

The LPD process uses a liquid obtained by the saturation of powdered silicon dioxide (silica gel) and the later addition of H$_3$BO$_3$ into liquid H$_2$SiF$_6$. When the substrate is placed in the liquid, a silicon dioxide film can be deposited on the substrate. Specifically, the deposition of silicon dioxide by the LPD process is given by the following equations:

(1)

(2)

Saturation of the powdered silicon dioxide moves reaction (1) to the left side, and the later addition of H$_3$BO$_3$ consumes HF by reaction (2) and moves reaction (1) to the right side again. As a result, the right hand reaction of equation (1) causes an oversaturated state of silicon dioxide, and thus silicon dioxide can be deposited on the substrate. These reactions occur at room temperature. Since the deposition uses hydrophobic silicon dioxide formed by the LPD process, the silicon dioxide is not deposited on a hydrophilic film such as a resist. A silicon dioxide film formed by the LPD method provides good uniformity of thickness because of the low deposition rate (i.e., about 1000 Å/hour).

Returning to FIG. 3(*d*), a bit line resist pattern 160 is formed on pillar resist pattern 150 and silicon dioxide film 155. The lithography process for forming resist pattern 160 uses a mask having a polarity which is opposite to the polarity of the mask used to form the patterned resist 50 in the conventional process of FIG. 1. Alternatively, the same mask used to form the patterned resist 50 in the conventional process of FIG. 1 can be used with a resist of a polarity type which is opposite to the polarity type of the resist used in the conventional process. Because of the relaxed wafer topography, an antireflective coating (ARC) 162 may be used, if desired, in the lithography process as is known in the art. Such a coating cuts down on light scattering into the resist. Then, as shown in FIG. 3(*e*), a second silicon dioxide film 165 is formed on the first silicon dioxide layer 155 using the LPD process. Again, because the deposition uses hydrophobic silicon dioxide, no silicon dioxide is formed on the resist pattern 160. The level of silicon dioxide film 165 is substantially the same as the level of resist pattern 160. Silicon dioxide films 155 and 165 constitute the interlayer insulating film 135 of FIG. 2. Next, as shown in FIG. 3(*f*), the resist patterns 150 and 160 are removed simultaneously using a conventional resist stripping process to form an opening 170. Then, as shown in FIG. 3(*g*), a conductive layer 145 is deposited and planarized using chemical mechanical polishing. Conductive layer 145 may be any conductive material such as molybdenum, polysilicon, aluminum, tungsten, copper, molybdenum silicide (MoSi), tungsten silicide (WSi), and the like.

As noted above, in an alternative embodiment, a buffer silicon dioxide layer may be provided before the contact lithography to prevent contact between the resist pattern 150 and substrate 105. In this case, a thin silicon dioxide layer (not shown) having a thickness of about 100 Å is formed by thermal oxidation on diffusion regions 122 of FIG. 3(*a*). A light etching process such as a wet etch is used to open up the bit line contact after the removal of the resist patterns 150 and 160 in the step of FIG. 3(*f*) and prior to forming conductive layer 145 in the step of FIG. 3(*g*).

As described above, a metallization structure may be formed without etching. By avoiding etching processes, the fabrication of LSI devices may be simplified and the cost of the fabrication may be reduced. In addition, because of the relaxed wafer topography, a fine resist having a large process margin can be made. Also, the need for using high resolution lithography processes is mitigated.

While there has been shown and described the preferred embodiments of the invention, it will be evident to those skilled in the art that various modifications may be made thereto without departing from the spirit and scope of the invention as set forth in the appended claims.

I claim:

1. A method of forming a conductive structure, comprising the steps of:

forming a first resist pattern on a substrate;

forming a first insulating layer on said substrate, but not on said first resist pattern;

forming a second resist pattern on said first insulating layer and said first resist pattern;

forming a second insulating layer on said first insulating layer, but not said second resist pattern;

removing said first and second patterns to form an opening in said first and second insulating layers; and forming a conductive layer in said opening.

2. The method according to claim 1, wherein said conductive layer is a metal.

3. The method according to claim 2, wherein the conductive layer is formed of a material selected from the group consisting of tungsten, molybdenum, polysilicon, aluminum, copper, molybdenum silicide, and tungsten silicide.

4. The method according to claim 1, wherein the first and second insulating layers are formed by a liquid phase deposition process.

5. The method according to claim 1, wherein said substrate is a silicon substrate.

6. The method according to claim 1, wherein said first resist pattern is formed on a diffusion region formed on a surface of said substrate.

7. The method according to claim 1, wherein a buffer silicon dioxide layer is formed on said substrate prior to forming said first resist pattern.

8. The method according to claim 1, wherein said buffer silicon dioxide layer is removed after said opening is formed and prior to forming said conductive layer.

9. The method according to claim 1, wherein said substrate includes a conductive layer formed on a body of semiconductor material.

10. The method according to claim 1, wherein said first insulating film is formed to a level substantially equal to a level of said first mask pattern.

11. The method according to claim 1, wherein said second insulating film is formed to a level substantially equal to a level of said second mask pattern.

* * * * *